(12) United States Patent
Lu

(10) Patent No.: US 12,096,618 B2
(45) Date of Patent: Sep. 17, 2024

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 320 days.

(21) Appl. No.: 17/651,089

(22) Filed: Feb. 15, 2022

(65) Prior Publication Data

US 2022/0302128 A1 Sep. 22, 2022

Related U.S. Application Data

(63) Continuation of application No. PCT/CN2021/120339, filed on Sep. 24, 2021.

(30) Foreign Application Priority Data

Mar. 22, 2021 (CN) .......................... 202110302133.4

(51) Int. Cl.
*H10B 12/00* (2023.01)
*H01L 21/768* (2006.01)

(52) U.S. Cl.
CPC ..... *H10B 12/482* (2023.02); *H01L 21/76829* (2013.01); *H01L 21/7685* (2013.01); *H10B 12/053* (2023.02)

(58) Field of Classification Search
CPC ................ H10B 12/482; H10B 12/053; H10B 12/0335; H01L 21/76829; H01L 21/7685; H01L 21/7682
See application file for complete search history.

(56) References Cited

U.S. PATENT DOCUMENTS 7,307,008 B2 * 12/2007 Oh .................... H01L 21/76897
438/533
2002/0119649 A1 8/2002 Sun et al.
(Continued)

FOREIGN PATENT DOCUMENTS

CN 1209811 C 7/2005
CN 101075093 A 11/2007
CN 111710679 A 9/2020

OTHER PUBLICATIONS

International Search Report cited in PCT/CN2021/120339 mailed Dec. 29, 2021, 9 pages.

*Primary Examiner* — David Vu
(74) *Attorney, Agent, or Firm* — Syncoda LLC; Feng Ma

(57) ABSTRACT

The present application provides a method of manufacturing a semiconductor structure and a semiconductor structure. The method of manufacturing a semiconductor structure includes: forming a first conductive layer in a first trench of a substrate, where a top surface of the first conductive layer is recessed; forming a bit line structure on the first conductive layer; forming a third dielectric layer and a fourth dielectric layer, where the fourth dielectric layer at least covers the bottom and a side wall of a second trench; and removing a part of the first dielectric layer and the fourth dielectric layer that covers the bottom of the second trench, to form a third trench, where the third trench exposes the substrate. The semiconductor structure is manufactured through the method of manufacturing a semiconductor structure.

13 Claims, 10 Drawing Sheets

(56) References Cited

U.S. PATENT DOCUMENTS

2006/0228852 A1 10/2006 Chien
2021/0050255 A1 2/2021 Hsu et al.

* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Patent Application No. PCT/CN2021/120339, filed on Sep. 24, 2021, which claims priority to the Chinese Patent Application No. 202110302133.4, titled "METHOD OF MANUFACTURING SEMICONDUCTOR STRUCTURE AND SEMICONDUCTOR STRUCTURE" and filed to China National Intellectual Property Administration on Mar. 22, 2021. The entire contents of International Patent Application No. PCT/CN2021/120339 and Chinese Patent Application No. 202110302133.4 are incorporated herein by reference.

TECHNICAL FIELD

The present application relates to the technical field of semiconductor manufacturing, and in particular, to a method of manufacturing a semiconductor structure and a semiconductor structure.

BACKGROUND

Dynamic random access memory (DRAM) is a semiconductor memory that randomly write and read data at a high speed, and is widely used in data storage devices or apparatuses.

A DRAM includes multiple repeated memory cells. Each of the memory cells typically includes a capacitor and a transistor. A gate of the transistor is connected to a word line (WL), a drain of the transistor is connected to a bit line (BL), and a source of the transistor is connected to the capacitor. A voltage signal on the word line may be used to read data information stored in the capacitor or write data information into the capacitor for storage. As feature sizes of DRAM devices constantly shrink, feature sizes of bit lines and spacings between adjacent bit lines constantly decrease. Currently, a bit line is manufactured through etching. To be specific, a portion between adjacent bit lines in a composite deposition layer is removed through etching, and the remaining composite deposition layer forms a bit line.

However, the above-mentioned etching process easily damages a surface structure of the bit line, causing the bit line to tilt or collapse. This reduces structural stability and signal transmission performance of the bit line, and affects storage performance of a semiconductor memory.

SUMMARY

According to a first aspect, the present application provides a method of manufacturing a semiconductor structure, including:
providing a substrate, wherein the substrate includes an active region and an isolation region;
sequentially forming a first dielectric layer and a second dielectric layer on the substrate;
removing a part of the first dielectric layer and a part of the second dielectric layer, to form a first trench;
forming a first conductive layer in the first trench, where a top surface of the first conductive layer is recessed;
forming a bit line structure on the first conductive layer, where the bit line structure covers a surface of the first conductive layer, and a top surface of the bit line structure is lower than a top surface of the first dielectric layer;
forming a third dielectric layer, where the first trench is fully filled with the third dielectric layer, and a top surface of the third dielectric layer is flush with a top surface of the second dielectric layer;
removing the second dielectric layer, to form a second trench;
forming a fourth dielectric layer, where the fourth dielectric layer at least covers a bottom and a side wall of the second trench; and
removing a part of the first dielectric layer and the fourth dielectric layer that covers the bottom of the second trench, to form a third trench, where the third trench exposes the substrate.

According to a second aspect, the present application further provides a semiconductor structure, including:
a substrate, where the substrate includes an active region and an isolation region;
a first conductive layer, located on the substrate, where a top surface of the first conductive layer is recessed;
a bit line structure, where the bit line structure includes a barrier layer and a second conductive layer that are stacked on the first conductive layer, and the bit line structure is electrically connected to the active region through the first conductive layer; and
a bit line protective layer, where the bit line protective layer covers at least a top surface and a side wall of the bit line structure, and there is a third trench between adjacent bit line protective layers.

The structure and other objectives and beneficial effects of the present application will be described in detail with reference to the drawings to make the preferred embodiments more obvious and understandable.

BRIEF DESCRIPTION OF THE DRAWINGS

To describe the technical solutions in the embodiments of the present application or in the prior art more clearly, the following briefly describes the drawings required for describing the embodiments or the prior art. Apparently, the drawings in the following description show some embodiments of the present application, and a person of ordinary skill in the art may still derive other drawings from these accompanying drawings without creative efforts.

DETAILED DESCRIPTION

Figure 1:
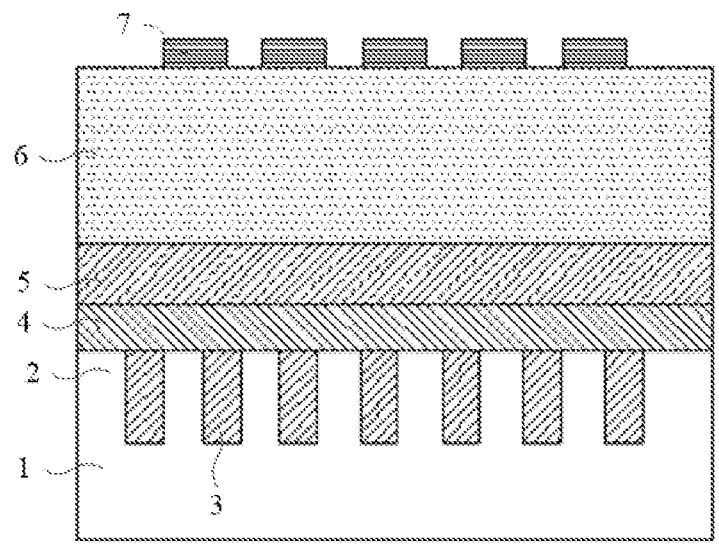
FIG. 1 is a schematic structural diagram of a semiconductor structure in the related art.
Figure 2:
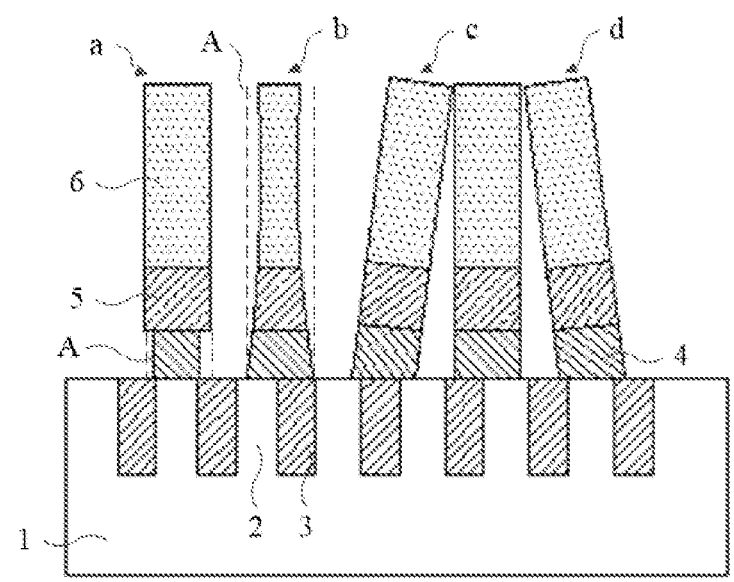
FIG. 2 is a schematic structural diagram of a bit wire of a semiconductor structure in the related art.

As found by the inventor of the present application in an actual research process, as feature sizes of DRAM devices constantly shrink, feature sizes of bit lines and spacings between adjacent bit lines in DRAM devices constantly decrease. FIG. 1 is a schematic structural diagram of a semiconductor structure in the related art. FIG. 2 is a schematic structural diagram of a bit wire of a semiconductor structure in the related art. Referring to FIG. 1 and FIG. 2, currently, a bit line is manufactured through etching. A substrate 1 having an active region 2 and an isolation region 3 may be first formed, a titanium nitride layer 4 and a metal tungsten layer 5 are sequentially formed on the substrate 1, and a silicon nitride layer 6 is formed on a top surface of the metal tungsten layer 5. A bit line mask layer 7 is formed on a top surface of the silicon nitride layer 6, and the bit line mask layer 7 is used to etch the titanium nitride layer 4 and the metal tungsten layer 5, thereby forming a bit line. In an etching process, due to limitation of the etching process, an etching depth cannot be precisely controlled. As a result, the formed bit line is prone to structural damage such as necking.

Referring to FIG. 2, in a bit line a formed by the titanium nitride layer 4 and the metal tungsten layer 5 on the leftmost side, the titanium nitride layer 4 near the substrate 1 is subject to structural damage due to excessive etching, and a defect region A is formed at this position. Alternatively, the metal tungsten layer 5 away from a side of the substrate 1 in a bit line b is first affected by an etching medium, resulting in excessive etching. As a result, a structural size of the bit line b is uneven and similarly, a defect region A may be formed at this position. Alternatively, a bit line c and a bit line d tilt. The above-mentioned bit line structures may all cause bit lines to collapse, affect structural stability of the bit lines. In addition, the above-mentioned bit line structures cause signal transmission interruption in the bit lines, and affect storage performance of a DRAM device.

In view of this, the embodiments of the present application provide a method of manufacturing a semiconductor structure and a semiconductor structure. A first dielectric layer and a second dielectric layer are formed on a substrate, a first trench is formed, and a first conductive layer and a bit line structure are formed through the first trench. A top surface of the first conductive layer is recessed, and the first conductive layer serves as the basis for disposing the bit line structure. The bit line structure is disposed on the first conductive layer, and a contact area of a barrier layer and a second conductive layer of the bit line structure increases, which helps to improve conductivity of the bit line structure. The bit line structure is formed by depositing the barrier layer and the second conductive layer on the first conductive layer, which can effectively avoid that the bit line structure tilts or collapses due to damage. A bit line protective layer is formed on a top surface and a side wall of the bit line structure, to strengthen protection of the bit line structure. An isolation layer is disposed on a side wall of the bit line protective layer, which can effectively avoid impact of external oxygen or impurities on the bit line structure, improve the bit line structure and signal transmission stability, and help to optimize storage performance of the semiconductor structure.

In order to make the objectives, technical solutions, and advantages of the present application clearer, the technical solutions in the embodiments of the present application are described in further detail below with reference to the drawings in the exemplary embodiments of the present application. In the drawings, the same or similar numerals represent the same or similar elements or elements having the same or similar functions throughout the specification. The described embodiments are some rather than all of the embodiments of the present application. The embodiments described below with reference to the drawings are exemplary, and are only used to explain the present application but should not be construed as a limitation to the present application. All other embodiments obtained by those of ordinary skill in the art based on the embodiments of the present application without creative efforts should fall within the protection scope of the present application. The embodiments of the present application are described in detail below with reference to the drawings.

Figure 3:
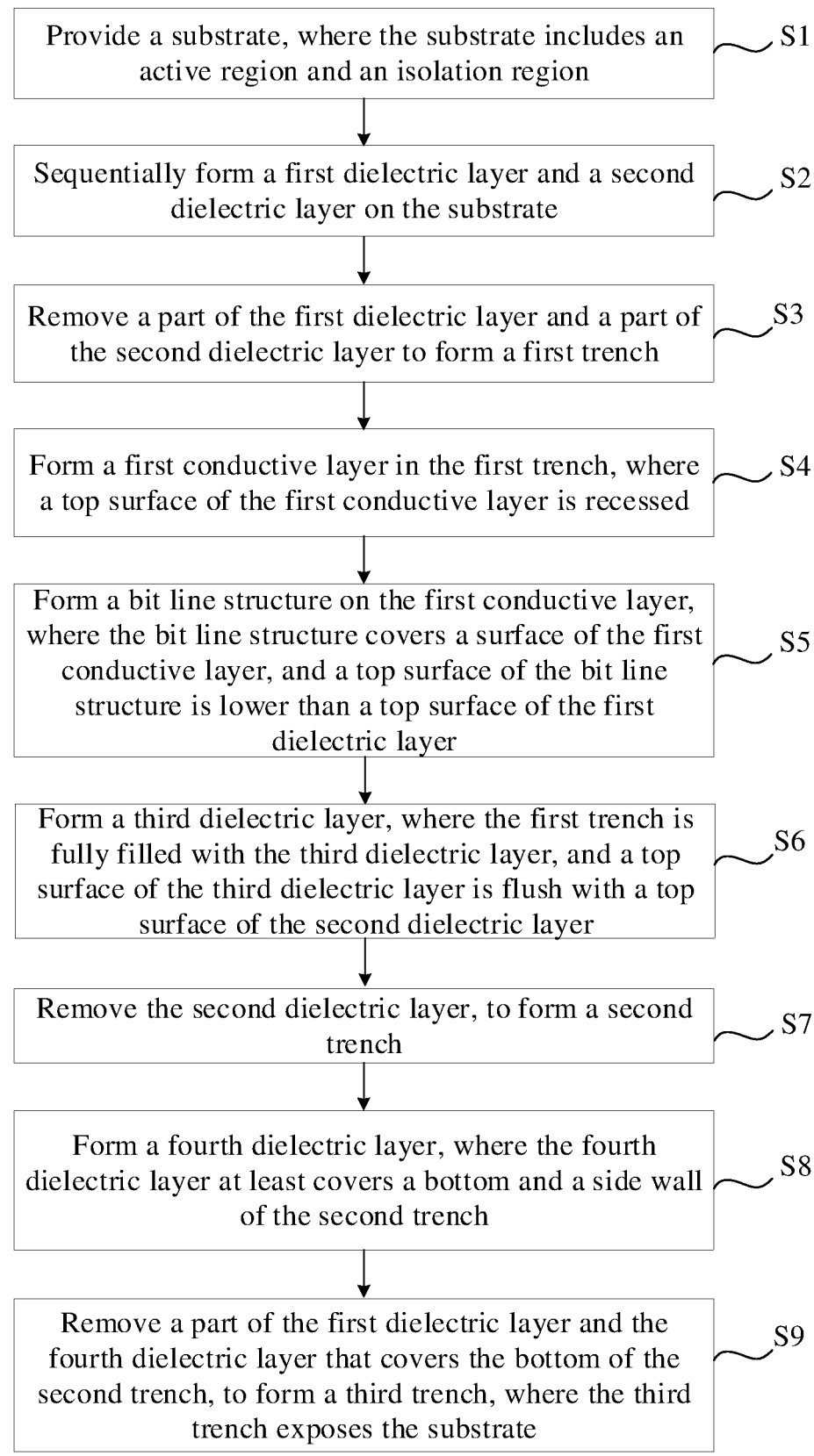
FIG. 3 is a schematic flowchart of a method of manufacturing a semiconductor structure according to an embodiment of the present application.
Figure 4:
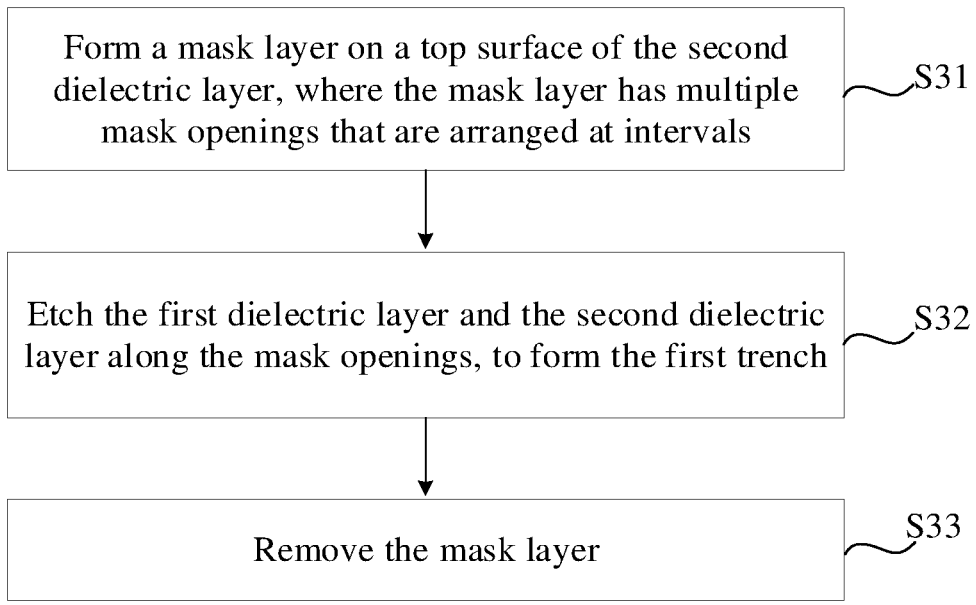
FIG. 4 is a schematic flowchart of forming a first trench in a method of manufacturing a semiconductor structure according to an embodiment of the present application.
Figure 5:
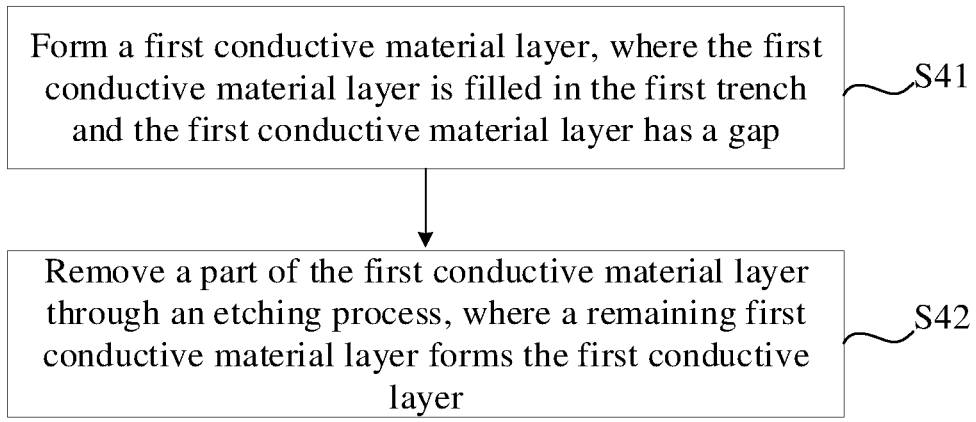
FIG. 5 is a schematic flowchart of forming a first conductive layer in a method of manufacturing a semiconductor structure according to an embodiment of the present application.
Figure 6:
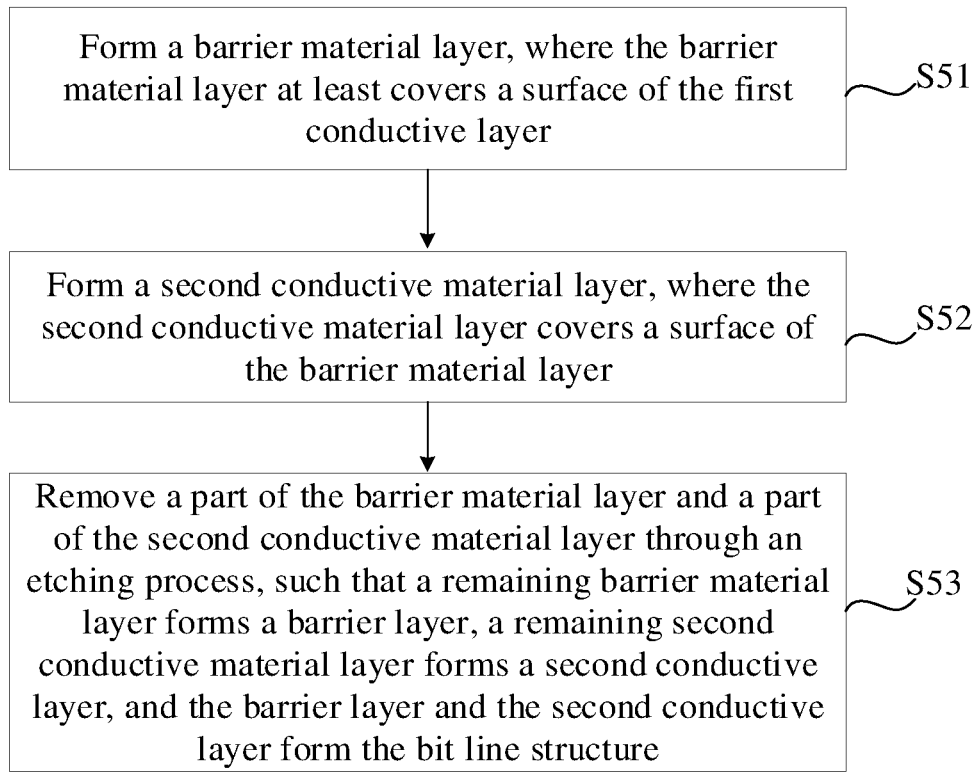
FIG. 6 is a schematic flowchart of forming a bit line structure in a method of manufacturing a semiconductor structure according to an embodiment of the present application.
Figure 7:
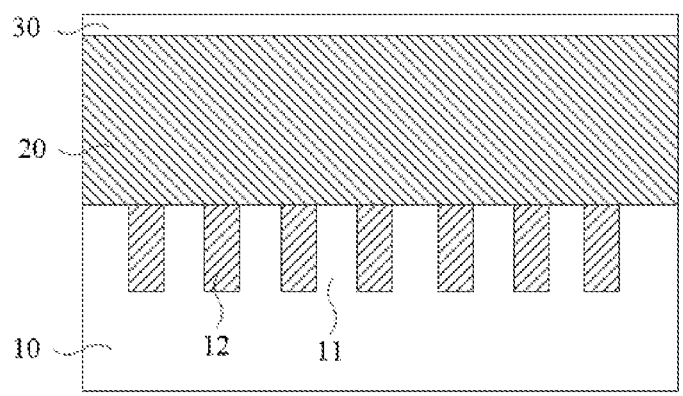
FIG. 7 is a schematic structural diagram of a substrate, a first dielectric layer, and a second dielectric layer of a semiconductor structure according to an embodiment of the present application.
Figure 8:
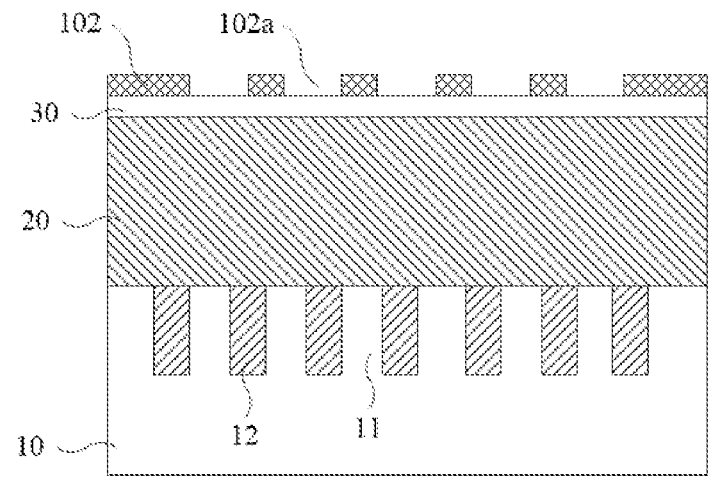
FIG. 8 is a schematic structural diagram of a mask layer formed on a top surface of a second dielectric layer of a semiconductor structure according to an embodiment of the present application.
Figure 9:
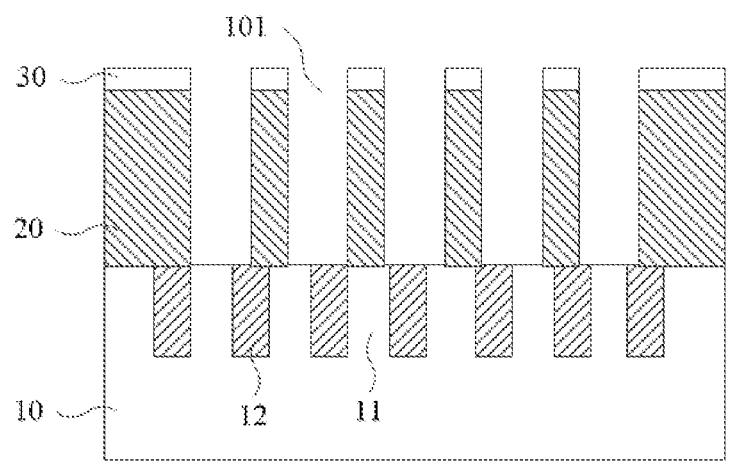
FIG. 9 is a schematic structural diagram of a first trench formed in a semiconductor structure according to an embodiment of the present application.
Figure 10:
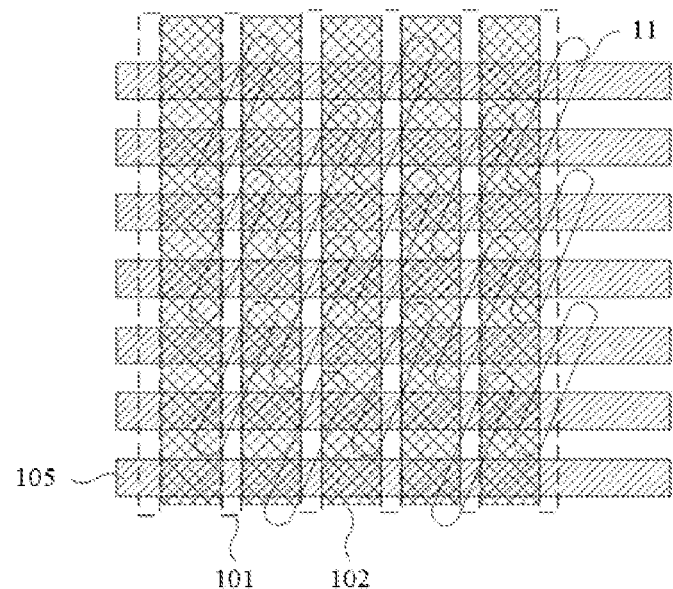
FIG. 10 is a top view of a first trench formed in a semiconductor structure according to an embodiment of the present application.
Figure 11:
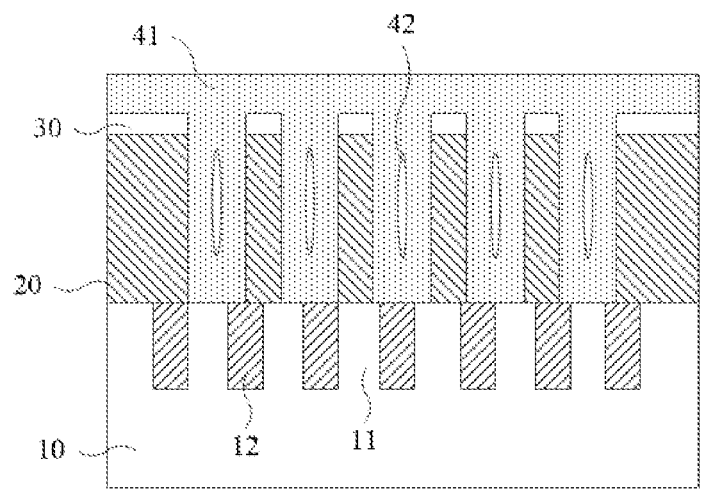
FIG. 11 is a schematic structural diagram of a first conductive material layer formed in a semiconductor structure according to an embodiment of the present application.
Figure 12:
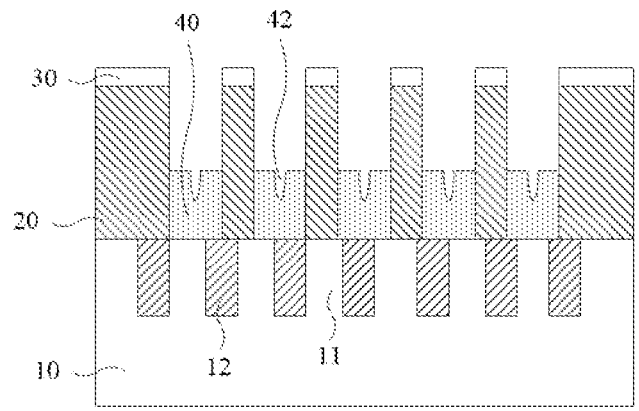
FIG. 12 is a schematic structural diagram of a first conductive layer formed in a semiconductor structure according to an embodiment of the present application.
Figure 13:
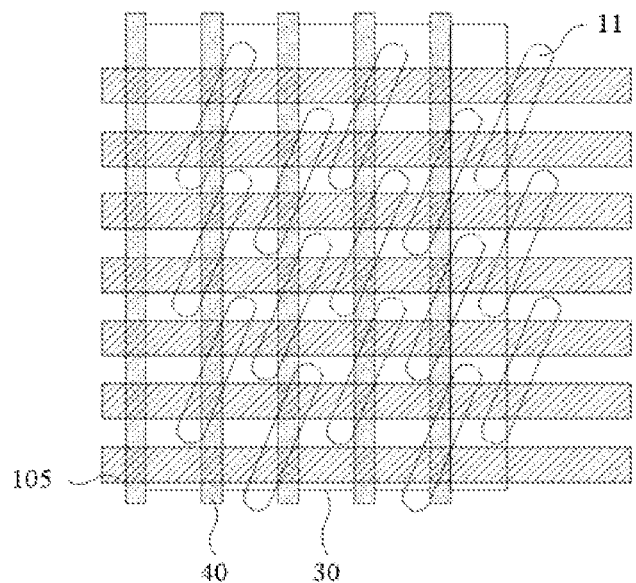
FIG. 13 is a top view of a first conductive layer formed in a semiconductor structure according to an embodiment of the present application.
Figure 14:
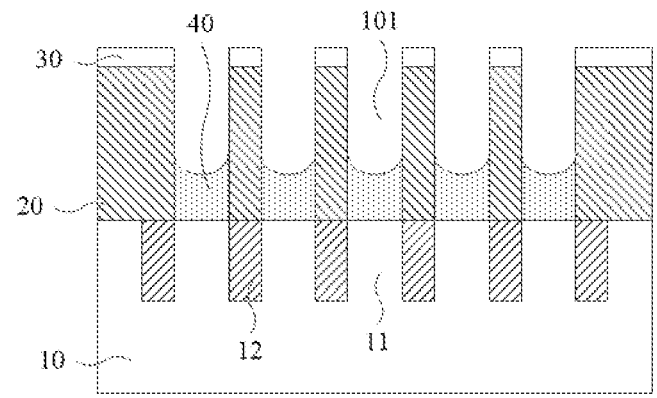
FIG. 14 is a schematic structural diagram of a recessed first conductive layer formed in a semiconductor structure according to an embodiment of the present application.
Figure 15:
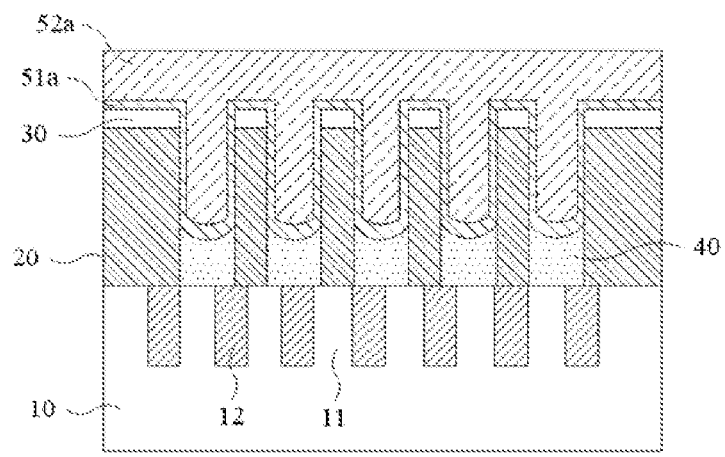
FIG. 15 is a schematic structural diagram of a barrier material layer and a second conductive material layer formed in a semiconductor structure according to an embodiment of the present application.
Figure 16:
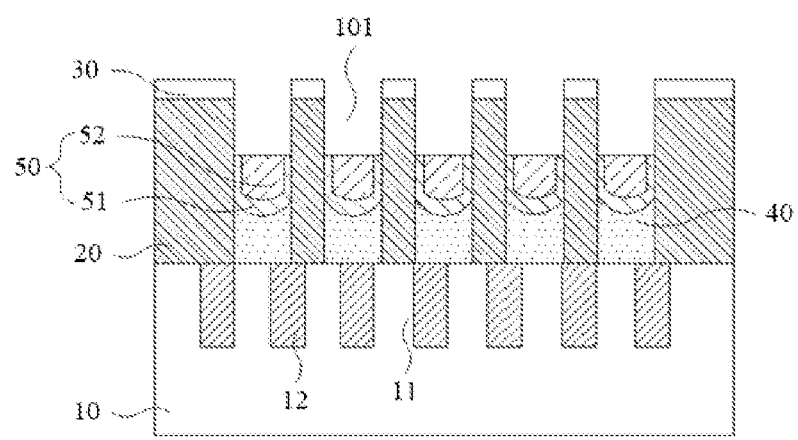
FIG. 16 is a schematic structural diagram of a barrier layer and a second conductive layer formed in a semiconductor structure according to an embodiment of the present application.
Figure 17:
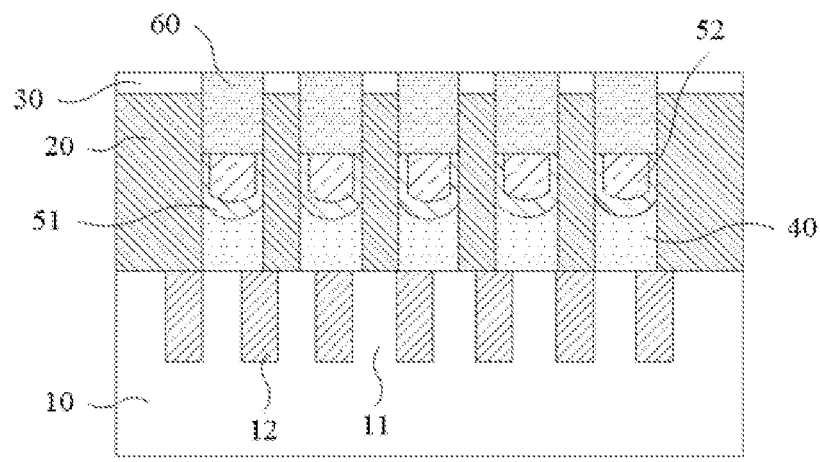
FIG. 17 is a schematic structural diagram of a third dielectric layer formed in a semiconductor structure according to an embodiment of the present application.
Figure 18:
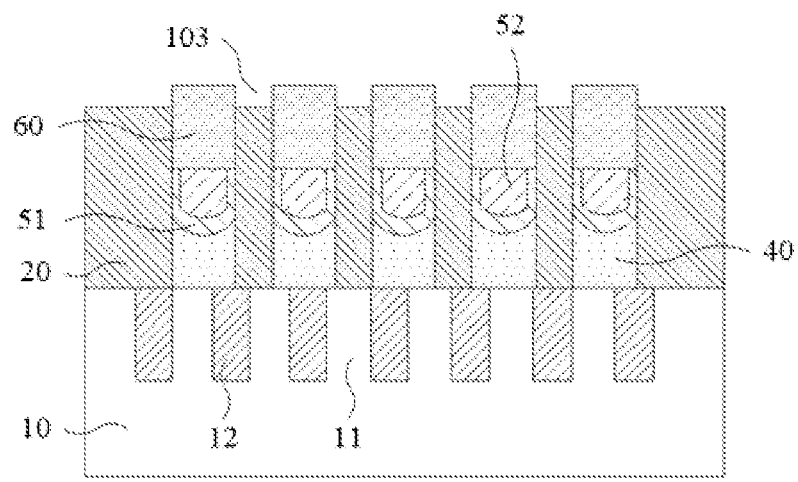
FIG. 18 is a schematic structural diagram of a second trench formed in a semiconductor structure according to an embodiment of the present application.
Figure 19:
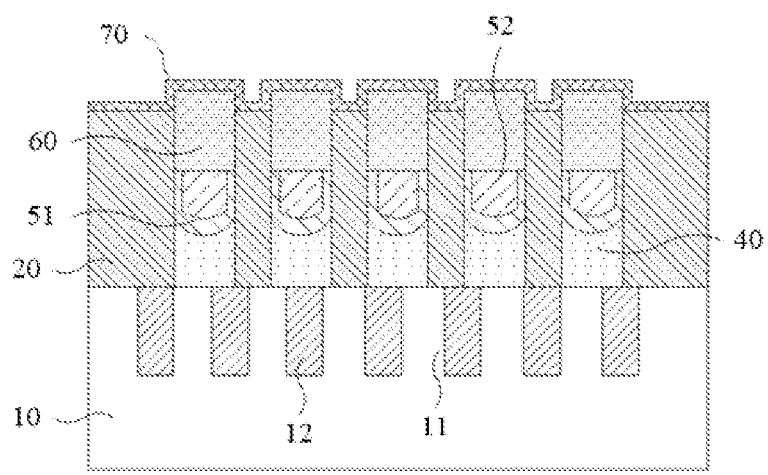
FIG. 19 is a schematic structural diagram of a fourth dielectric layer formed in a semiconductor structure according to an embodiment of the present application.
Figure 20:
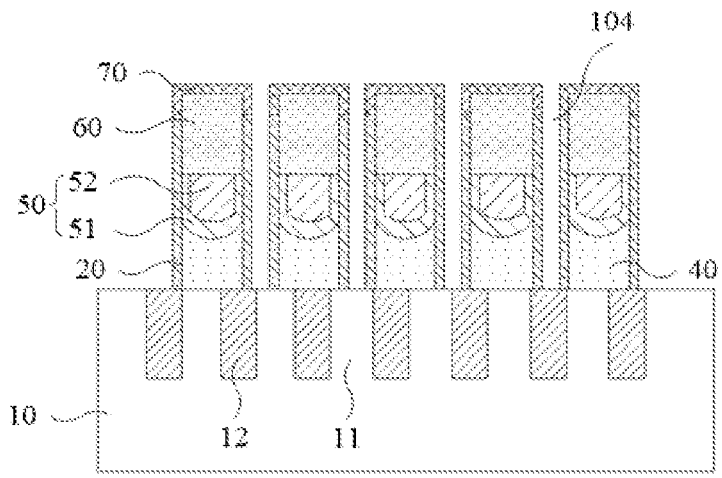
FIG. 20 is a schematic structural diagram of a third trench formed in a semiconductor structure according to an embodiment of the present application.
Figure 21:
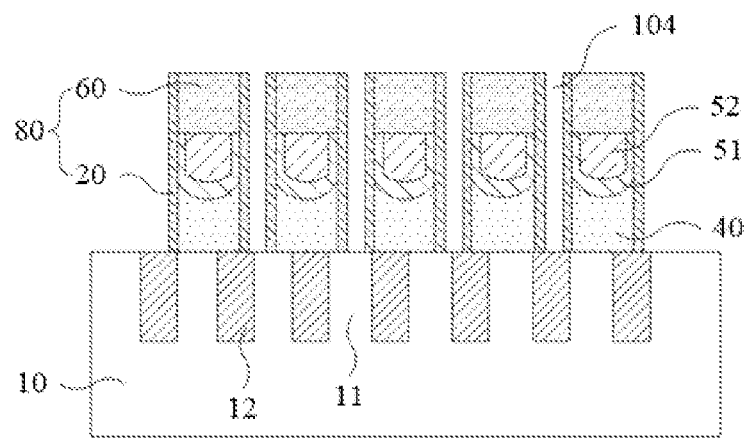
FIG. 21 is a schematic structural diagram of a bit line protective layer formed in a semiconductor structure according to an embodiment of the present application.
Figure 22:
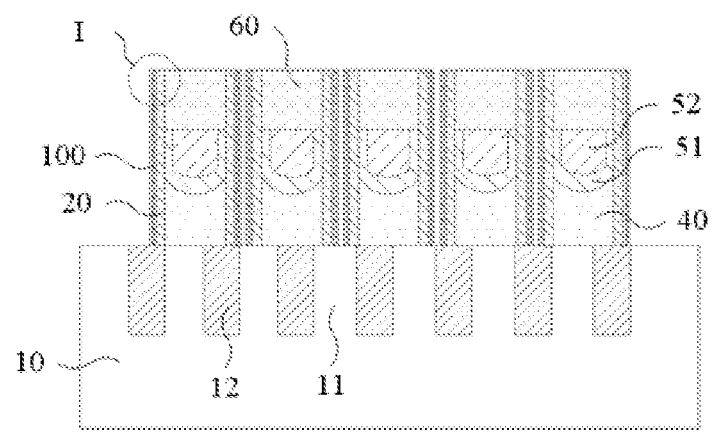
FIG. 22 is a schematic structural diagram of an isolation layer formed in a semiconductor structure according to an embodiment of the present application.
Figure 23:
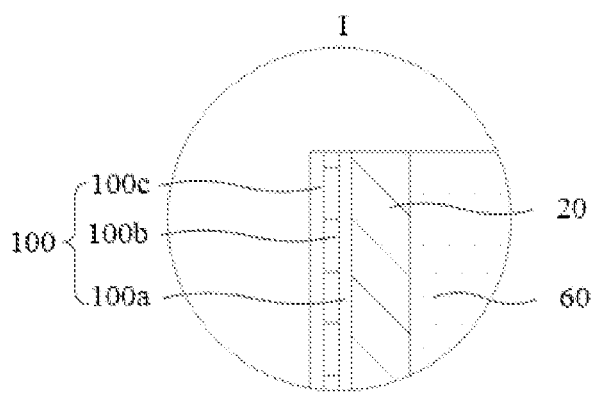
FIG. 23 is a schematic structural diagram of a part of an I part shown in FIG. 22 according to an embodiment of the present application.

FIG. 3 is a schematic flowchart of a method of manufacturing a semiconductor structure according to an embodiment of the present application. FIG. 4 is a schematic flowchart of forming a first trench in a method of manufacturing a semiconductor structure according to an embodiment of the present application. FIG. 5 is a schematic flowchart of forming a first conductive layer in a method of manufacturing a semiconductor structure according to an embodiment of the present application. FIG. 6 is a schematic flowchart of forming a bit line structure in a method of manufacturing a semiconductor structure according to an embodiment of the present application. FIG. 7 is a schematic structural diagram of a substrate, a first dielectric layer, and a second dielectric layer of a semiconductor structure according to an embodiment of the present application. FIG. 8 is a schematic structural diagram of a mask layer formed on a top surface of a second dielectric layer of a semiconductor structure according to an embodiment of the present application. FIG. 9 is a schematic structural diagram of a first trench formed in a semiconductor structure according to an embodiment of the present application. FIG. 10 is a top view of a first trench formed in a semiconductor structure according to an embodiment of the present application. FIG. 11 is a schematic structural diagram of a first conductive material layer formed in a semiconductor structure according to an embodiment of the present application. FIG. 12 is a schematic structural diagram of a first conductive layer formed in a semiconductor structure according to an embodiment of the present application. FIG. 13 is a top view of a first conductive layer formed in a semiconductor structure according to an embodiment of the present application. FIG. 14 is a schematic structural diagram of a recessed first conductive layer formed in a semiconductor structure according to an embodiment of the present application. FIG. 15 is a schematic structural diagram of a barrier material layer and a second conductive material layer formed in a semiconductor structure according to an embodiment of the present application. FIG. 16 is a schematic structural diagram of a barrier layer and a second conductive layer formed in a semiconductor structure according to an embodiment of the present application. FIG. 17 is a schematic structural diagram of a third dielectric layer formed in a semiconductor structure according to an embodiment of the present application. FIG. 18 is a schematic structural diagram of a second trench formed in a semiconductor structure according to an embodiment of the present application. FIG. 19 is a schematic structural diagram of a fourth dielectric layer formed in a semiconductor structure according to an embodiment of the present application. FIG. 20 is a schematic structural diagram of a third trench formed in a semiconductor structure according to an embodiment of the present application. FIG. 21 is a schematic structural diagram of a bit line protective layer formed in a semiconductor structure according to an embodiment of the present application. FIG. 22 is a schematic structural diagram of an isolation layer formed in a semiconductor structure according to an embodiment of the present application. FIG. 23 is a schematic structural diagram of a part of an I part shown in FIG. 22 according to an embodiment of the present application.

Referring to FIG. 3 to FIG. 6 and FIG. 7 to FIG. 23, an embodiment of the present application further provides a method of manufacturing a semiconductor structure. The method includes:

S1: Provide a substrate, where the substrate includes an active region and an isolation region.

It should be noted that a material of the substrate 10 may be monocrystalline silicon, polycrystalline silicon, amorphous silicon, silicon germanium compound, silicon-on-insulator (SOI), or other materials known to those skilled in the art. The substrate 10 may provide support basis for a structural layer on the substrate 10. In this embodiment, the substrate 10 is a Si substrate. The substrate 10 may be provided with a semiconductor layer. The semiconductor layer forms an active region 11 of the substrate 10. The active region 11 includes a source region and a drain region, and an isolation region 12 is formed between the source region and the drain region. A shallow trench isolation (STI) structure may be provided in the isolation region 12.

S2: Sequentially form a first dielectric layer and a second dielectric layer on the substrate.

It should be noted that a first dielectric layer 20 and a second dielectric layer 30 may be manufactured through chemical deposition, the first dielectric layer 20 may be a silicon nitride layer, and the second dielectric layer 30 may be a silicon oxide layer.

For structures of the substrate 10, the first dielectric layer 20, and the second dielectric layer 30, refer to FIG. 7. Active regions 11 and isolation regions 12 may be disposed in the substrate 10 at intervals in a staggered manner.

Refer to FIG. 3 and FIG. 4. S3: Remove a part of the first dielectric layer and a part of the second dielectric layer to form a first trench. It should be noted that in step 3, the method may specifically include:

S31: Form a mask layer on a top surface of the second dielectric layer, where the mask layer has multiple mask openings that are arranged at intervals. A mask layer 102 may be a photoresist layer, and a position at which a bit line structure 50 needs to be formed is reserved on the mask layer 102, thereby forming mask openings 102a. A structure of the mask layer 102 may be shown in FIG. 8.

S32: Etch the first dielectric layer and the second dielectric layer along the mask openings to form the first trench.

S33: Remove the mask layer.

The first dielectric layer 20 and the second dielectric layer 30 at the mask openings 102a may be removed through an etching process, to form the first trench 101. The bit line structure 50 formed in the first trench 101 may be electrically connected to the source region or the drain region in the active region 11. For a structure of the formed first trench 101, refer to FIG. 9.

As shown in FIG. 10, the semiconductor structure may include a word line 105 disposed in the substrate 10. The word line 105 may be disposed in a form of an embedded word line 105, and multiple word lines 105 are disposed at intervals along a first direction. Multiple first trenches 101 on the substrate 10 are disposed at intervals along a second direction. The second direction intersects the first direction or is perpendicular to the first direction, and the first trench 101 is used to form the bit line structure 50.

Refer to FIG. 3 and FIG. 5. S4: Form a first conductive layer in the first trench, where a top surface of the first conductive layer is recessed. Step 4 may specifically include:

S41: Form a first conductive material layer, where the first conductive material layer is filled in the first trench and the first conductive material layer has a gap.

S42: Remove a part of the first conductive material layer through an etching process, where the remaining first conductive material layer forms the first conductive layer.

It should be noted that a first conductive material layer 41 may be formed through deposition, and this structure may be shown in FIG. 11. In a deposition process, a gap 42 is inevitably generated due to a structural defect. To reduce impact of the gap 42 on the first conductive material layer 41, in this embodiment, a gap opening of the gap 42 may be exposed after a part of the first conductive material layer 41 is removed through etching, and the gap 42 is used to subsequently form a recessed structure of the first conductive layer 40. Referring to FIG. 12, the remaining first conductive material layer 41 forms the first conductive layer 40.

A material forming the first conductive material layer 41 is polycrystalline silicon doped with phosphorus. Based on high solid solubility of phosphorus and silicon, the doping of phosphorus can increase a doping amount and help to improve conductivity of polycrystalline silicon.

As an achievable implementation, the step of forming the first conductive material layer 41 includes: at 480° C. to 520° C., introducing mixed gas of $SiH_4$ and $PH_3$ into the first trench 101, and manufacturing the first conductive material layer 41 through a low-pressure chemical deposition method. The low-pressure chemical deposition method can improve structural uniformity during deposition of the first conductive material layer 41 and reduce structural defects generated during manufacturing.

Further, the first conductive layer 40 continues to be etched along a position of the gap opening to expand the gap opening, thereby forming a V-shaped or arc-shaped structure on a top surface of the first conductive layer 40. The V-shaped or arc-shaped structure forms a recessed shape of the top surface of the first conductive layer 40. This structure may be shown in FIG. 14.

As shown in FIG. 13, in the semiconductor structure in which the first conductive layer 40 is deposited, the first conductive layer 40 is filled in a part of the first trench 101, and corresponds to the active region 11 of the substrate 10 based on the first trench 101. After the first conductive layer 40 covers the first trench 101, the first conductive layer 40 may be in electrical contact with the active region 11 of the substrate 10, thereby forming an electrical connection structure. This subsequently helps the bit line structure 50 to electrically connect to the active region 11 through the first conductive layer 40, and the first conductive layer 40 forms a bit line contact (BLC) structure.

Refer to FIG. 3 and FIG. 6. S5: Form a bit line structure 50 on the first conductive layer 40, where the bit line structure 50 covers a surface of the first conductive layer 40, and a top surface of the bit line structure 50 is lower than that of the first dielectric layer 20. Step 5 may specifically include:

S51: Form a barrier material layer, where the barrier material layer at least covers a surface of the first conductive layer.

S52: Form a second conductive material layer, where the second conductive material layer covers a surface of the barrier material layer.

It should be noted that structures of the barrier material layer 51a and the second conductive material layer 52a may be shown in FIG. 15. The barrier material layer 51a may cover a surface of the first conductive layer 40, a side wall surface of the first trench 101, and a surface of the second dielectric layer 30. The second conductive material layer 52a covers a surface of the barrier material layer 51a. The barrier material layer 51a may be a titanium nitride layer, and the second conductive material layer 52a may be a metal tungsten layer.

S53: Remove a part of the barrier material layer and a part of the second conductive material layer through an etching process, such that the remaining barrier material layer forms a barrier layer, the remaining second conductive material layer forms a second conductive layer, and the barrier layer and the second conductive layer form the bit line structure.

It should be noted that the bit line structure 50 formed by removing a part of the barrier material layer 51a and a part of the second conductive material layer 52a may be shown in FIG. 16. The bit line structure 50 formed by the barrier layer 51 and the second conductive layer 52 is located in the first trench 101, but the first trench 101 is not fully filled with the bit line structure 50, that is, a top surface of the second conductive layer 52 is spaced from an opening position of the first trench 101 by a certain distance.

As the top surface of the first conductive layer 40 is recessed, at least a part of each of the barrier layer 51 and the second conductive layer 52 formed on the first conductive layer 40 is recessed, which can increase a contact area of the barrier layer 51 and the second conductive layer 52, thereby improving conductivity of the bit line structure 50.

Further, referring to FIG. 16, a top surface of the barrier layer 51 is flush with that of the second conductive layer 52. Such arrangement can improve flatness of the top surface of the bit line structure 50, and help to subsequently dispose a third dielectric layer 60.

Refer to FIG. 17. S6: Form a third dielectric layer, where the first trench is fully filled with the third dielectric layer, and a top surface of the third dielectric layer is flush with that of the second dielectric layer. It should be noted that the third dielectric layer 60 covers the top surface of the bit line structure 50, which can protect the bit line structure 50.

In addition, a material forming the first dielectric layer 20 is the same as that forming the third dielectric layer 60, both of which are silicon nitride. Such arrangement can reduce manufacturing difficulty, that is, during manufacturing, a same material and a same manufacturing process may be used to form the first dielectric layer 20 and the third dielectric layer 60, thereby reducing complexity of the process and helping to reduce manufacturing difficulty. A same material can improve material compatibility between the first dielectric layer 20 and the third dielectric layer 60, and avoid a structural defect at a junction of the first dielectric layer 20 and the third dielectric layer 60, to ensure stability of the semiconductor structure.

Refer to FIG. 18. S7: Remove the second dielectric layer, to form a second trench. In this step, the second dielectric layer 30 may be removed through an etching process.

Refer to FIG. 19. S8: Form a fourth dielectric layer, where the fourth dielectric layer at least covers the bottom and a side wall of the second trench. The fourth dielectric layer 70 may be a silicon oxide layer.

Herein, it should be emphasized that a thickness of the fourth dielectric layer 70 is 8 mm to 15 mm. A part of the first dielectric layer 20 and the fourth dielectric layer 70 that covers the bottom of the second trench 103 need to be removed through vertical etching in the subsequent step 9. Therefore, the thickness of the first dielectric layer 20 reserved on the side wall of the bit line structure 50 after etching is completed in step 9 depends on the thickness of the fourth dielectric layer 70 on the side wall of the second trench 103. Therefore, when the thickness of the fourth dielectric layer 70 is excessively small, the thickness of the first dielectric layer 20 reserved on the side wall of the bit line structure 50 is excessively small, and the bit line structure 50 cannot be protected by the first dielectric layer 20.

Further, since the semiconductor structure subsequently needs to be provided with another structural layer such as a capacitive contact structure, when the thickness of the fourth dielectric layer 70 is excessively large, it becomes more difficult to subsequently deposit the capacitive contact structure. Therefore, in an actual manufacturing process, a user may select a specific thickness of the fourth dielectric layer 70 within the above-mentioned range according to needs. For example, the thickness may be 9 mm, 10 mm, or 13 mm and is preferably 12 mm in this embodiment.

A process of forming the fourth dielectric layer 70 is an atomic layer deposition method, and precursor gas selected in a deposition process may be mixed gas of $C_6H_{17}NSi$ and $O_2$.

Refer to FIG. 20. S9: Remove a part of the first dielectric layer and the fourth dielectric layer that covers the bottom of the second trench, to form a third trench, where the third trench exposes the substrate.

It should be noted that etching is vertically performed along the fourth dielectric layer 70 on the side wall of the second trench 103, to remove a part of the first dielectric layer 20 and the fourth dielectric layer 70 that covers the bottom of the second trench 103, and the thickness of the remaining first dielectric layer 20 is the thickness of the fourth dielectric layer 70 on the side wall of the second trench 103. Through the above-mentioned etching, multiple bit line structures 50 that are independent of each other may be formed.

Referring to FIG. 21, after step 9, the method may further include:

removing the fourth dielectric layer 70 and a part of the third dielectric layer 60, and exposing the top surface of the first dielectric layer 20, where the top surface of the first dielectric layer 20 is flush with a top surface of the remaining third dielectric layer 60.

The first dielectric layer 20 and the remaining third dielectric layer 60 form a bit line protective layer 80.

It should be noted that the top surface of the first dielectric layer 20 is flush with the top surface of the third dielectric layer 60 can improve structural flatness of the bit line protective layer 80, which facilitates subsequent arrangement of a capacitive contact structure in the semiconductor structure. In this embodiment, the above-mentioned method of manufacturing a semiconductor structure can avoid the problem of damage to the bit line caused when the bit line is formed through etching in the related art. Besides, the bit line protective layer 80 formed by the first dielectric layer 20 and the third dielectric layer 60 may be formed on the side wall and the top surface of the bit line structure 50, which improves protection of the bit line structure 50.

Referring to FIG. 22 and FIG. 23, after the step of removing the fourth dielectric layer 70 and a part of the third dielectric layer 60, and exposing the top surface of the first dielectric layer 20, where the top surface of the first dielectric layer 20 is flush with a top surface of the remaining third dielectric layer 60, the method may further include:

forming an isolation layer 100 on a side wall of the first dielectric layer 20, where the isolation layer 100 includes a first isolation layer 100a, a second isolation layer 100b, and a third isolation layer 100c that are stacked; where a material of the first isolation layer 100a is the same as that of the third isolation layer 100c and is different from that of the second isolation layer 100b.

It should be noted that the material of the first isolation layer 100a and the material of the third isolation layer 100c may be silicon nitride, and the material of the second isolation layer 100b may be silicon oxide. The stacked silicon nitride-silicon oxide-silicon nitride structures are disposed, such that this can effectively avoid that outside oxygen and impurities enter the bit line structure 50 and affect performance of the device, and can also reduce a parasitic capacitance of the device as much as possible.

It should be noted that in the method of manufacturing the semiconductor structure, silicon nitride, silicon oxide, and polycrystalline silicon may be etched through a chemical etching method, and etching gas may be $SF_6$, $CF_4$, $CHF_3$, $O_2$, Ar, or mixed gas of any combination thereof. In the etching process, a ratio of the mixed gas is adjusted to achieve a specific selection ratio of the etching gas, thereby achieving selective etching.

Based on the above-mentioned content, an embodiment of the present application further provides a semiconductor structure. The semiconductor structure includes:

a substrate 10, where the substrate includes an active region 11 and an isolation region 12;

a first conductive layer 40, located on the substrate 10, where a top surface of the first conductive layer 40 is recessed;

a bit line structure 50, where the bit line structure 50 includes a barrier layer 51 and a second conductive layer 52 that are stacked on the first conductive layer 40, and the bit line structure 50 is electrically connected to the active region 11 through the first conductive layer 40; and a bit line protective layer 80, where the bit line protective layer 80 covers at least a top surface and a side wall of the bit line structure 50, and there is a third trench 104 between adjacent bit line protective layers 80.

Further, an isolation layer 100 is further included, and the isolation layer 100 covers a sidewall of the bit line protection layer 80.

The isolation layer 100 includes a first isolation layer 100a, a second isolation layer 100b, and a third isolation layer 100c that are stacked;

where a material of the first isolation layer 100a is the same as that of the third isolation layer 100c and is different from that of the second isolation layer 100b.

It should be noted that the semiconductor structure may be a DRAM device. The substrate 10, the first conductive layer 40, the bit line structure 50, the bit line protection layer 80, and the isolation layer 100 are some layer structures of the DRAM device. These layer structures and technical effects thereof have been described above, and are not repeated herein.

A material of the first isolation layer 100a and a material the third isolation layer 100c may be silicon nitride, and a material of the second isolation layer 100b may be silicon oxide. The isolation layer 100 covers a sidewall surface of the bit line protection layer 80, such that this can effectively avoid that external oxygen and impurities enter the bit line structure 50, and can prevent this from affecting performance of the device. Further, the isolation layer 100 can also reduce a parasitic capacitance of the device as much as possible.

In addition to the above-mentioned layer structures, the DRAM device may further include a transistor structure, a capacitor structure, and a word line 105. The DRAM device may further include an array of multiple memory cells formed on the substrate 10, and each memory cell includes a capacitor structure and a transistor structure.

The capacitor structure is configured to store data, the transistor structure may control access of the capacitor structure to data, and a gate of the transistor structure is connected to the word line 105. The drain region of the substrate 10 is connected to the bit line structure 50, and the source region of the substrate 10 is connected to the capacitor structure. A voltage signal on the word line 105 may control switching on or switching off of the transistor structure, and then the bit line structure 50 is configured to read data information stored in the capacitor structure, or the bit line structure 50 is configured to write data information into the capacitor structure for storage, to implement data access of the DRAM device. Therefore, when the semiconductor structure of this embodiment is applied to the DRAM device, access performance of the DRAM device can be improved.

In the above description, it should be understood that unless otherwise clearly specified, the terms such as "mounting", "interconnection", and "connection" are intended to be understood in a broad sense. For example, the "connection" may be a fixed connection, an indirect connection via a medium, or a communication or interaction between two elements. A person of ordinary skill in the art may understand specific meanings of the foregoing terms in the present application based on a specific situation. Orientations or position relationships indicated by terms "upper", "lower", "front", "rear", "vertical", "horizontal", "top", "bottom", "inside", "outside", etc. are orientation or position relationships as shown in the drawings, and these terms are just used to facilitate description of the present application and simplify the description, but not to indicate or imply that the mentioned device or elements must have a specific orientation and must be established and operated in a specific orientation, and thus, these terms cannot be understood as a limitation to the present application. In the description of the present application, "multiple" means two or more, unless otherwise specifically defined.

The terms "first", "second", "third", "fourth", and so on (if any) in the specification, claims and the drawings of the present application are intended to distinguish between similar objects but do not necessarily indicate a specific order or sequence. It should be understood that the data used in such a way may be exchanged under proper conditions to make it possible to implement the described embodiments of the present application in other sequences apart from those illustrated or described here. Moreover, the terms "include", "contain", and any other variants mean to cover the non-exclusive inclusion, for example, a process, method, system, product, or device that includes a list of steps or units is not necessarily limited to those steps or units which are clearly listed, but may include other steps or units which are not expressly listed or inherent to such a process, method, product, or device.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the scope of the technical solutions of the embodiments of the present application.

The invention claimed is:

1. A method of manufacturing a semiconductor structure, comprising:
   providing a substrate, wherein the substrate comprises an active region and an isolation region;
   sequentially forming a first dielectric layer and a second dielectric layer on the substrate;
   removing a part of the first dielectric layer and a part of the second dielectric layer, to form a first trench;
   forming a first conductive layer in the first trench, wherein a top surface of the first conductive layer is recessed;
   forming a bit line structure on the first conductive layer, wherein the bit line structure covers a surface of the first conductive layer, and a top surface of the bit line structure is lower than a top surface of the first dielectric layer;
   forming a third dielectric layer, wherein the first trench is fully filled with the third dielectric layer, and a top surface of the third dielectric layer is flush with a top surface of the second dielectric layer;
   removing the second dielectric layer, to form a second trench;
   forming a fourth dielectric layer, wherein the fourth dielectric layer at least covers a bottom and a side wall of the second trench; and
   removing a second part of the first dielectric layer and a part of the fourth dielectric layer that covers the bottom of the second trench, to form a third trench, wherein the third trench exposes the substrate.

2. The method of manufacturing a semiconductor structure according to claim 1, wherein the forming a first conductive layer in the first trench comprises:
   forming a first conductive material layer, wherein the first trench is filled with the first conductive material layer and the first conductive material layer has a gap; and
   removing a part of the first conductive material layer by an etching process, wherein a remaining portion of the first conductive material layer forms the first conductive layer.

3. The method of manufacturing a semiconductor structure according to claim 2, wherein
   a material of the first conductive material layer is polycrystalline silicon doped with phosphorus.

4. The method of manufacturing a semiconductor structure according to claim 3, wherein the forming a first conductive material layer comprises:
   at 480° °C. to 520° C., introducing mixed gas of $SiH_4$ and $PH_3$ into the first trench, and manufacturing the first conductive material layer by a low-pressure chemical deposition method.

5. The method of manufacturing a semiconductor structure according to claim 1, wherein the forming a bit line structure on the first conductive layer comprises:
   forming a barrier material layer, wherein the barrier material layer at least covers the surface of the first conductive layer;
   forming a second conductive material layer, wherein the second conductive material layer covers a surface of the barrier material layer; and
   removing a part of the barrier material layer and a part of the second conductive material layer by an etching process, wherein a remaining portion of the barrier material layer forms a barrier layer, a remaining portion of the second conductive material layer forms a second conductive layer, the barrier layer and the second conductive layer form the bit line structure, and the barrier layer covers a side wall and a bottom surface of the second conductive layer.

6. The method of manufacturing a semiconductor structure according to claim 5, wherein
a top surface of the barrier layer is flush with a top surface of the second conductive layer.

7. The method of manufacturing a semiconductor structure according to claim 1, wherein
a material of the first dielectric layer is the same as a material of the third dielectric layer.

8. The method of manufacturing a semiconductor structure according to claim 1, wherein
a process of forming the fourth dielectric layer is atomic layer deposition.

9. The method of manufacturing a semiconductor structure according to claim 1, wherein
a thickness of the fourth dielectric layer is 8 nm to 15 nm.

10. The method of manufacturing a semiconductor structure according to claim 1, wherein the removing a part of the first dielectric layer and a part of the second dielectric layer, to form a first trench comprises:
forming a mask layer on the top surface of the second dielectric layer, wherein the mask layer has multiple mask openings that are arranged at intervals;
etching the first dielectric layer and the second dielectric layer along the multiple mask openings, to form the first trench; and
removing the mask layer.

11. The method of manufacturing a semiconductor structure according to claim 1, after the removing a second part of the first dielectric layer and a part of the fourth dielectric layer that covers the bottom of the second trench, to form a third trench, further comprising:
removing the fourth dielectric layer and a part of the third dielectric layer, and exposing the top surface of the first dielectric layer, wherein the top surface of the first dielectric layer is flush with a top surface of a remaining portion of the third dielectric layer;
wherein the first dielectric layer and the remaining portion of the third dielectric layer form a bit line protective layer.

12. The method of manufacturing a semiconductor structure according to claim 11, after the removing the fourth dielectric layer and a part of the third dielectric layer, and exposing the top surface of the first dielectric layer, further comprising:
forming an isolation layer on a side wall of the first dielectric layer, wherein the isolation layer comprises a first isolation layer, a second isolation layer, and a third isolation layer that are stacked;
wherein a material of the first isolation layer is the same as a material of the third isolation layer, and the material of the first isolation layer is different from a material of the second isolation layer.

13. The method of manufacturing a semiconductor structure according to claim 12, wherein
the material of the first isolation layer and the material of the third isolation layer are silicon nitride, and the material of the second isolation layer is silicon oxide.

* * * * *